US012727623B2

(12) United States Patent
Pilatowicz

(10) Patent No.: US 12,727,623 B2
(45) Date of Patent: Sep. 8, 2026

(54) AEROSOL GENERATION DEVICE POWER SYSTEM COMPRISING TWO BATTERY CELLS

(71) Applicant: JT International SA, Geneva (CH)

(72) Inventor: Grzegorz Aleksander Pilatowicz, Grens (CH)

(73) Assignee: JT International SA, Geneva (CH)

( * ) Notice: Subject to any disclaimer, the term of this patent is extended or adjusted under 35 U.S.C. 154(b) by 367 days.

(21) Appl. No.: 18/572,628

(22) PCT Filed: Jun. 24, 2022

(86) PCT No.: PCT/EP2022/067363
§ 371 (c)(1),
(2) Date: Dec. 20, 2023

(87) PCT Pub. No.: WO2022/269043
PCT Pub. Date: Dec. 29, 2022

(65) Prior Publication Data

US 2024/0298713 A1 Sep. 12, 2024

(30) Foreign Application Priority Data

Jun. 24, 2021 (EP) .................................... 21181571

(51) Int. Cl.
*A24F 40/53* (2020.01)
*A24F 40/20* (2020.01)
(Continued)

(52) U.S. Cl.
CPC .............. *A24F 40/53* (2020.01); *A24F 40/20* (2020.01); *A24F 40/57* (2020.01);
(Continued)

(58) Field of Classification Search
CPC .......... A24F 40/53; A24F 40/20; A24F 40/57; G01R 31/3835; G01R 31/396;
(Continued)

(56) References Cited

U.S. PATENT DOCUMENTS 10,666,065 B2 5/2020 Crowe et al.
2009/0072625 A1 * 3/2009 Oga .................... H01M 10/482 307/80
(Continued)

FOREIGN PATENT DOCUMENTS

CN 102723758 A 10/2012
CN 204070543 U 1/2015
(Continued)

OTHER PUBLICATIONS

Baumhofer Thorsten et al: "Production caused variation in capacity aging trend and correlation to initial cell performance", Journal of Power Sources, Elsevier, Amsterdam, NL, vol. 247, Sep. 5, 2013 (Sep. 5, 2013), pp. 332-338, XP028760213.
(Continued)

*Primary Examiner* — Dennis R Cordray
(74) *Attorney, Agent, or Firm* — Lerner David LLP

(57) ABSTRACT

An aerosol generation device power system includes a first battery cell and a second battery cell connectable in series, a switch, and a controller. The controller controls the switch to switch the power system from a first state to a second state in response to determining that one of the battery cells does not have a sufficient energy level to finish an aerosolisation session, and the other battery cell does. In the first state, both battery cells are configured to provide power to a heater component in series. In the second state, one of the battery cells is connected to the heater component independently of the other, such that only the one of the battery cells that has
(Continued)

a sufficient energy level to finish the aerosolisation session is configured to provide power to the heater component.

15 Claims, 8 Drawing Sheets

(51) Int. Cl.

| | |
|---|---|
| ***A24F 40/57*** | (2020.01) |
| ***G01R 31/3835*** | (2019.01) |
| ***G01R 31/396*** | (2019.01) |
| ***H01M 10/42*** | (2006.01) |
| ***H01M 10/48*** | (2006.01) |

(52) U.S. Cl.
CPC ....... *G01R 31/3835* (2019.01); *G01R 31/396* (2019.01); *H01M 10/425* (2013.01); *H01M 10/482* (2013.01); *H01M 2010/4271* (2013.01); *H01M 2220/30* (2013.01)

(58) Field of Classification Search
CPC ............. H01M 10/425; H01M 10/482; H01M 2010/4271; H01M 2220/30
See application file for complete search history.

(56) References Cited

U.S. PATENT DOCUMENTS

| | | | | |
|---|---|---|---|---|
| 2015/0272223 | A1 | 10/2015 | Weigensberg et al. | |
| 2015/0305409 | A1 | 10/2015 | Verleur et al. | |
| 2019/0274354 | A1 * | 9/2019 | Sur ........................... | A24D 1/20 |
| 2020/0358297 | A1 * | 11/2020 | Sano ......................... | H02J 7/54 |

FOREIGN PATENT DOCUMENTS

| | | | |
|---|---|---|---|
| CN | 108565513 | A | 9/2018 |
| CN | 108988469 | A | 12/2018 |
| EP | 2100525 | A1 | 9/2009 |
| WO | 03/088373 | A2 | 10/2003 |

OTHER PUBLICATIONS

International Search Report for PCT/EP2022/067363 mailed Oct. 10, 2023. 4 pgs.

* cited by examiner

AEROSOL GENERATION DEVICE POWER SYSTEM COMPRISING TWO BATTERY CELLS

CROSS-REFERENCE TO RELATED APPLICATIONS

The present application is a national phase entry under 35 U.S.C. § 371 of International Application No. PCT/EP2022/067363, filed Jun. 24, 2022, published in English, which claims priority to European Application No. 21181571.7, filed Jun. 24, 2021, the disclosures of which are incorporated herein by reference.

FIELD OF INVENTION

The present invention relates to aerosol generation devices, and more specifically aerosol generation device power systems.

BACKGROUND

Aerosol generation devices such as electronic cigarettes and other aerosol inhalers or vaporisation devices are becoming increasingly popular consumer products.

Heating devices for vaporisation or aerosolisation are known in the art. Such devices typically include a heating chamber and heater. In operation, an operator inserts the product to be aerosolised or vaporised into the heating chamber. The product is then heated with an electronic heater to vaporise the constituents of the product for the operator to inhale. In some examples, the product is a tobacco product similar to a traditional cigarette. Such devices are sometimes referred to as "heat not burn" devices in that the product is heated to the point of aerosolisation, without being combusted.

A problem faced by known aerosol generation devices includes providing an effective use of energy.

SUMMARY OF INVENTION

In a first aspect, there is provided an aerosol generation device power system, wherein the power system is connectable to a heater component, and the power system comprises:

- a first battery cell and a second battery cell connectable in series;
- a switching means configured to control a power flow from the first battery cell and the second battery cell to the heater component; and
- a controller configured to monitor an energy parameter of each of the first battery cell and the second battery cell and to control the switching means, wherein the controller is configured to control the switching means to switch the power system from a first state to a second state in response to detecting a triggering condition, wherein:
- the triggering condition comprises the controller determining, based upon the monitored energy parameter of the first battery cell and the monitored energy parameter of the second battery cell, that one of the first battery cell or the second battery cell does not have a sufficient energy level to finish an aerosolisation session, and the other one of the first battery cell and the second battery cell does have a sufficient energy level to finish or prolong the aerosolisation session;
- in the first state, the first battery cell and the second battery cell are configured to provide power to the heater component in series; and
- in the second state, one of the first battery cell or the second battery cell is connected to the heater component independently of the other of the first battery cell or the second battery cell, such that only the one of the first battery cell or the second battery cell that has a sufficient energy level to finish or prolong the aerosolisation session is configured to provide power to the heater component.

In this way, advantages of connecting the battery cells in series are leveraged, whilst obviating an limitations to the performance of the power system that would occur if one of the battery cells in series was to have insufficient energy to complete an aerosolisation session. Advantages of connecting the battery cells in series can include a higher output voltage, which removes the need to include a DC/DC or step-up converter in the power system in order to provide the required power to the heater thereby reducing energy losses, allowing for the implementation of heater technologies that have a higher resistance in the device, allowing for the implementation of heater technologies that have a higher resistance in the device, allowing for a reduction in the maximum current requirements on each battery cell so that higher energy density batteries to be used, and the provision of more efficient and easier implementation of fast charging. As such, improvements are provided in the use of energy resources and in the provision of improved device design.

Preferably, the controller is configured to monitor the energy parameter of the first battery cell and the energy parameter of the second battery cell during an aerosolisation session; and

- in response to determining the triggering condition during the aerosolisation session, the controller is configured to switch the power system from the first state to the second state for a remainder of the aerosolisation session.

In this way, the weaker battery cell that does not have a sufficient energy level to finish an aerosolisation session does not limit the performance of the overall power system and an aerosolisation session that has already started can be completed or prolonged.

Preferably, the controller is configured to monitor the energy parameter of the first battery cell and the energy parameter of the second battery cell before beginning an aerosolisation session; and

- in response to determining the triggering condition before beginning the aerosolisation session, the controller is configured to set the power system to the second state for the aerosolisation session.

In this way, the weaker battery cell that does not have a sufficient energy level to finish an aerosolisation session does not limit the performance of the overall power system and an aerosolisation session can be carried out.

Preferably, in response to determining the triggering condition before beginning the aerosolisation session, the controller is further configured to increase a preheating time in the aerosolisation session.

In this way, the strain on the battery cell that does have sufficient energy for the aerosolisation session is reduced, and the single battery cell can perform the aerosolisation session without the weaker battery cell that does not have a sufficient energy level for the aerosolisation session limiting the performance of the overall power system.

Preferably, the energy parameter of the first battery cell is a voltage level of the first battery cell, and the energy parameter of the second battery cell is a voltage level of the second battery cell.

In this way, the controller can determine whether an aerosolisation session can be completed based upon a determination of the battery cell voltage.

Alternatively, the energy parameter of the first battery cell is a rate of change of the voltage level of the first battery cell as a function of time, and the energy parameter of the second battery cell is a rate of change of the voltage level of the second battery cell as a function of time.

Preferably, the controller is configured to determine that one of the first battery cell or the second battery cell does not have a sufficient energy level to finish an aerosolisation session, and the other one of the first battery cell and the second battery cell does have a sufficient energy level to finish or prolong the aerosolisation session based upon a difference between the voltage level of the first battery cell and the voltage level of the second battery cell with a predetermined threshold voltage.

Preferably, when the voltage of a battery cell is above the predetermined threshold voltage, the battery cell is determined to have sufficient energy to complete or prolong the aerosolisation session. Preferably, when the voltage is not above the predetermined threshold voltage, the battery cell is determined to not have sufficient energy to complete the aerosolisation session.

Alternatively, the controller determines that one of the first battery cell or the second battery cell does not have a sufficient energy level to finish an aerosolisation session, and the other battery cell does have a sufficient energy level to finish or prolong the aerosolisation session, when the difference between the monitored energy parameters (e.g. voltages) between the two battery cells exceeds a predetermined threshold difference. When the difference between the monitored energy parameters (e.g. voltages) between the two battery cells exceeds a predetermined threshold difference, the battery cell with the lower voltage can be considered to be the battery cell that does not have a sufficient energy level to finish an aerosolisation session.

Preferably, the first battery cell and the second battery cell are components of a 2s1p battery pack.

In this way, a 2s1p battery pack can be integrated into an aerosol generation device which brings about advantages in that such a battery pack or 'pouch cell' can provide power for a plurality of aerosolisation sessions (for example 20 sessions) between charges. The series connection between the battery cells in a 2s1p pack also provides a higher output voltage.

A 2s1p battery pack can provides improved safety. For example, when compared to a 1s2p battery, when one cell is internally short-circuited (or moves into low voltage state), the other cell cannot discharge itself through it, thereby avoiding generating excess heat. Furthermore, compared to using two independent batteries, a 2s1p battery pack can provide improved efficiency and higher voltage. Two independent batteries can also have more complex control that can require various chargers and chips for parallel charging, thereby increasing costs and design complexity in the device. Using a 2s1p battery pack avoids these problems.

Preferably, the switching means comprises a first switching means connected in series with the second battery cell, and the second battery cell is connected between the first battery cell and the first switching means.

Preferably, the switching means comprises a second switching means connected to a node between the first battery cell and the second battery cell, and in parallel with the second battery cell, such that when the second switching means is closed the second battery cell is bypassable.

Preferably, the switching means comprises a third switching means connected to a node between the first battery cell and the second battery cell and in parallel with first battery cell, such that when the third switching means is closed the first battery cell is bypassable.

Preferably the first switching means, second switching means, and/or third switching means are each a transistor controlled by the controller.

Preferably, the aerosol generation device power system further comprises a pulse width modulation module configured to convert the power flow from the first battery cell and/or second battery cell to a pulse width modulated power flow to be delivered to the heater component.

In this way, a fixed power level can be output from the first and/or second battery cells, and can then be adjusted before delivery to the heater component.

In a second aspect, there is provided an aerosol generation device comprising the aerosol generation device power system of the first aspect.

Preferably, the aerosol generation device is configured to receive a tobacco rod, and heat without burning the tobacco rod to produce an aerosol in an aerosolisation session.

In a third aspect, there is provided a method of operating an aerosol generation device power system, the power system comprising a first battery cell and a second battery cell connectable in series, and a switching means configured to control a power flow from the first battery cell and the second battery cell to a heater component connectable to the power system, the method comprising:

- monitoring an energy parameter of each of the first battery cell and the second battery cell;
- detecting a triggering condition, wherein the triggering condition comprises determining, based upon the monitored energy parameter of the first battery cell and the monitored energy parameter of the second battery cell, that one of the first battery cell or the second battery cell does not have a sufficient energy level to finish an aerosolisation session, and the other one of the first battery cell and the second battery cell does have a sufficient energy level to finish or prolong the aerosolisation session; and
- controlling the switching means to switch the power system from a first state to a second state in response to detecting the triggering condition, wherein:
- in the first state, the first battery cell and the second battery cell are configured to provide power to the heater component in series; and
- in the second state, one of the first battery cell or the second battery cell is connected to the heater component independently of the other of the first battery cell or the second battery cell, such that only the one of the first battery cell or the second battery cell that has a sufficient energy level to finish or prolong the aerosolisation session is configured to provide power to the heater component.

In a fourth aspect, there is provided a non-transitory computer-readable medium storing instructions that, when executed by one or more processors of a controller configured for operation with an aerosol generation device power system comprising a first battery cell and a second battery cell connectable in series, and a switching means configured to control a power flow from the first battery cell and the second battery cell to a heater component connectable to the power system, cause the one or more processors to perform steps comprising:

monitoring an energy parameter of each of the first battery cell and the second battery cell;

detecting a triggering condition, wherein the triggering condition comprises determining, based upon the monitored energy parameter of the first battery cell and the monitored energy parameter of the second battery cell, that one of the first battery cell or the second battery cell does not have a sufficient energy level to finish an aerosolisation session, and the other one of the first battery cell and the second battery cell does have a sufficient energy level to finish or prolong the aerosolisation session; and controlling the switching means to switch the power system from a first state to a second state in response to detecting the triggering condition, wherein:

in the first state, the first battery cell and the second battery cell are configured to provide power to the heater component in series; and in the second state, one of the first battery cell or the second battery cell is connected to the heater component independently of the other of the first battery cell or the second battery cell, such that only the one of the first battery cell or the second battery cell that has a sufficient energy level to finish or prolong the aerosolisation session is configured to provide power to the heater component.

The aerosol generation device of the second aspect, the method of the third aspect and the non-transitory computer-readable medium of the fourth aspect can be combined with the preferable features of the first aspect, as appropriate.

BRIEF DESCRIPTION OF THE DRAWINGS

Embodiments of the invention are now described, by way of example, with reference to the drawings, in which.

DETAILED DESCRIPTION

Figure 1:
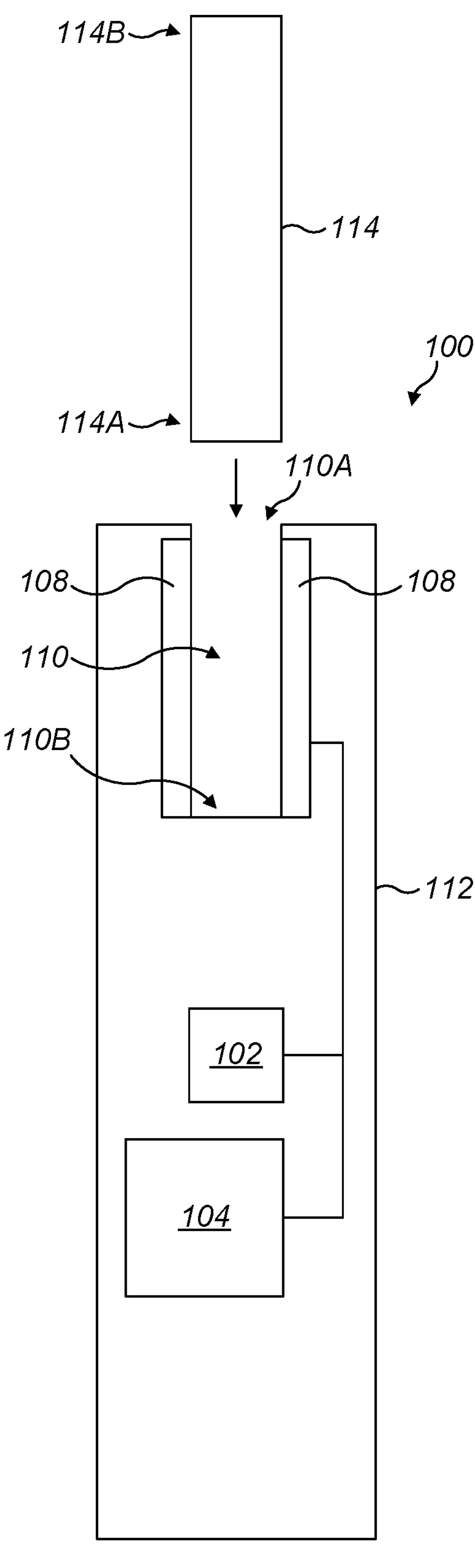
FIG. 1 is a block diagram of an aerosol generation device.

FIG. 1 shows a block diagram of the components of an aerosol generation device 100 or a vapor generation device, also known as an electronic cigarette.

For the purposes of the present description, it will be understood that the terms vapor and aerosol are interchangeable.

The aerosol generation device 100 has a body portion 112 containing controller 102, and a power system comprising an energy storage module 104. The power system is operable in a plurality of selectable operating modes. The controller 102 is configured to control a power flow of the energy storage module 104 based on the selected operating mode, as will be subsequently described. The controller 102 can be at least one microcontroller unit comprising memory, with instructions stored thereon for operating the aerosol generation device 100 including instructions for executing the selectable operating modes and controlling the power flows, and one or processors configured to execute the instructions.

In an example, a heater 108 is contained with the body portion 112. In such an example, as shown in FIG. 1, the heater 108 is arranged in a cavity 110 or chamber in the body portion 112. The cavity 110 is accessed by an opening 110A in the body portion 112. The cavity 110 is arranged to receive an associated aerosol generating consumable 114. The aerosol generating consumable can contain an aerosol generating material, such as a tobacco rod containing tobacco. A tobacco rod can be similar to a traditional cigarette. The cavity 110 has cross-section approximately equal to that of the aerosol generating consumable 114, and a depth such that when the associated aerosol generating consumable 114 is inserted into the cavity 110, a first end portion 114A of the aerosol generating consumable 114 reaches a bottom portion 110B of the cavity 110 (that is, an end portion 110B of the cavity 110 distal from the cavity opening 110A), and a second end portion 114B of the aerosol generating consumable 114 distal to the first end portion 114A extends outwardly from the cavity 110. In this way, a consumer can inhale upon the aerosol generating consumable 114 when it is inserted into the aerosol generation device 100. In the example of FIG. 1, the heater 108 is arranged in the cavity 110 such that the aerosol generating consumable 114 engages the heater 108 when inserted into the cavity 110. In the example of FIG. 1, the heater 108 is arranged as a tube in the cavity such that when the first end portion 114A of the aerosol generating consumable is inserted into the cavity the heater 108 substantially or completely surrounds the portion of the aerosol generating consumable 114 within the cavity 110. The heater 108 can be a wire, such as a coiled wire heater, or a ceramic heater, or any other suitable type of heater. The heater 108 can comprise multiple heating elements sequentially arranged along the axial length of the cavity that can be independently activated (i.e. powered up) in a sequential order.

In an alternative embodiment (not shown), the heater can be arranged as an elongate piercing member (such as in the form of needle, rod or blade) within the cavity; in such an embodiment the heater can be arranged to penetrate the aerosol generating consumable and engage the aerosol generating material when the aerosol generating consumable is inserted into the cavity.

In another alternative embodiment (not shown), the heater may be in the form of an induction heater. In such an embodiment, a heating element (i.e., a susceptor) can be provided in the consumable, and the heating element is inductively coupled to the induction element (i.e., induction coil) in the cavity when the consumable is inserted into the cavity. The induction heater then heats the heating element by induction.

It will be understood from the foregoing that the heater 108 can be a heater component such as a heating element or induction coil. Hereinafter, such a heater component is referred to the as a heater, although it will be understood that this term can refer to any of the aforementioned heater components as well as a heater more generally.

The heater 108 is arranged to heat the aerosol generating consumable 114 to a predetermined temperature to produce an aerosol in an aerosolisation session. An aerosolisation session can be considered as when the device is operated to produce an aerosol from the aerosol generating consumable 114. In an example in which the aerosol generating consumable 114 is a tobacco rod, the aerosol generating consumable 114 comprises tobacco. The heater 108 is arranged to heat the tobacco, without burning the tobacco, to generate an aerosol. That is, the heater 108 heats the tobacco at a predetermined temperature below the combustion point of the tobacco such that a tobacco-based aerosol is generated. The skilled person will readily understand that the aerosol generating consumable 114 does not necessarily need to comprise tobacco, and that any other suitable substance for aerosolisation (or vaporisation), particularly by heating without burning the substance, can be used in place of tobacco.

In an alternative, the aerosol generating consumable can be a vaporisable liquid. The vaporisable liquid can be contained in a cartridge receivable in the aerosol generation device, or can be directly deposited into the aerosol generation device.

The energy storage module 104 can be one or more batteries or battery pack(s). In a specific example, the energy storage module can be a 2s1p battery or battery pack that contains two battery cells connected in series.

The controller 102 is arranged to control the power flow of the energy storage module 104 based upon a selected operating mode of the aerosolisation session. The operating modes can include a preheating mode and a float mode.

Figure 2:
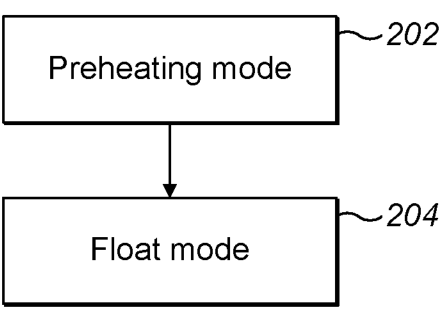
FIG. 2 is a flow diagram of operating modes of an aerosol generation device.

The progression from the preheating mode to the float mode can be understood from FIG. 2.

In the preheating mode 202, the heater 108 associated with the aerosol generation device 100 is heated to a predetermined temperature for the generation of an aerosol from the aerosol generating consumable 114. A preheating phase can be considered the time during which the preheating mode is being executed, for example the time it takes for the heater 108 to reach the predetermined temperature. The preheating mode occurs during a first time period of the aerosolisation session. In an example, the first time period can be a fixed pre-determined time period. In other examples, the first time period can vary corresponding to the length of time needed to heat the heater 108 to the predetermined temperature.

When the preheating phase is complete, the controller 102 ends the preheating mode 202 and controls the power system to perform the float mode 204. In the float mode 204 the controller 102 controls the power flow from the power system to maintain the heater 108 substantially at the predetermined temperature so that an aerosol is generated for the consumer to inhale. A float phase can be considered the time during which the float mode is being executed, for example the time during which the heater 108 is aerosolising one (or at least part of one) aerosol generating consumable 114 after the preheating phase. The controller 102 can control the power system to operate the float mode for a second time period of the aerosolisation session. The second time period can be predetermined and stored at the controller 102.

Figure 3A:
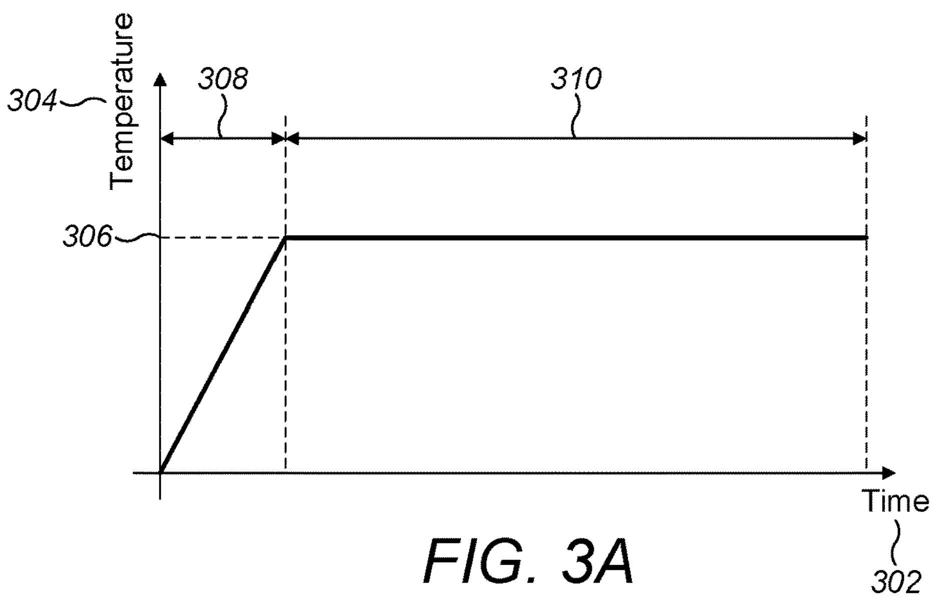
FIG. 3A is a plot of heater temperature against time for an aerosolisation session.
Figure 3B:
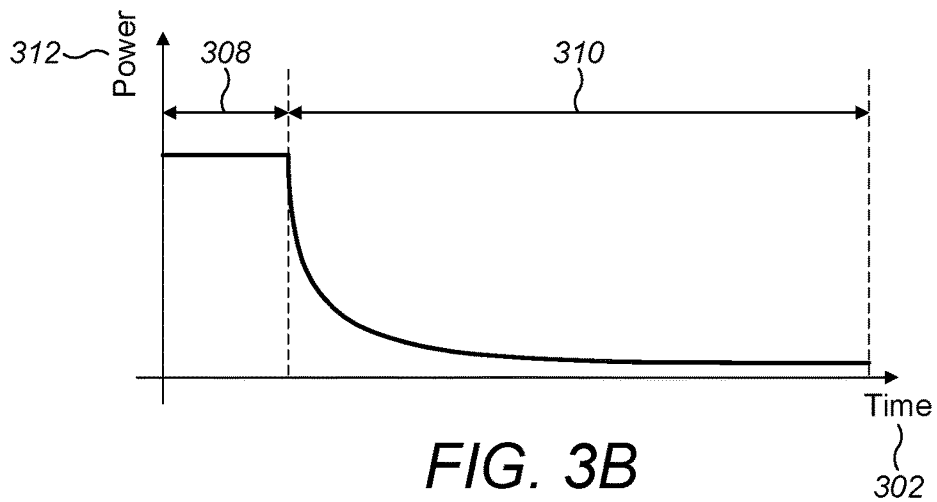
FIG. 3B is a plot of power delivered to the heater against time for an aerosolisation session.
Figure 3C:
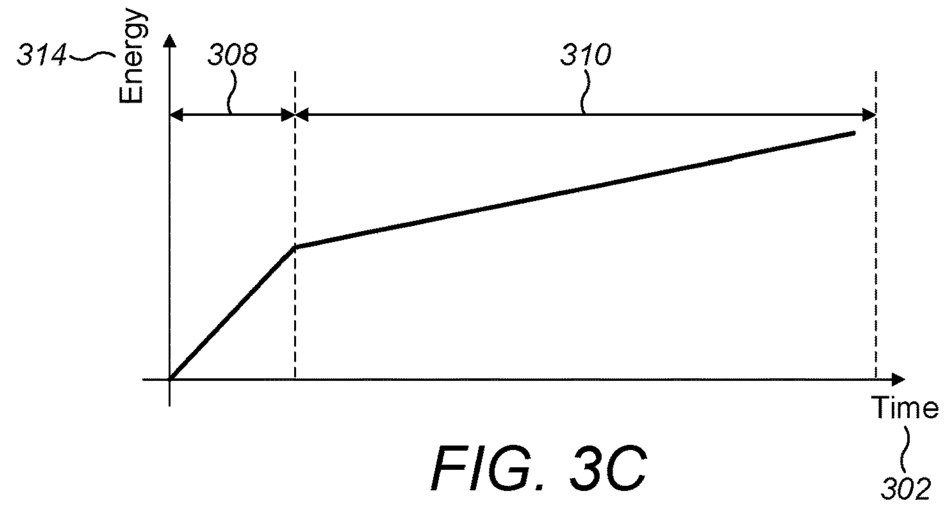
FIG. 3C is a plot of energy consumption against time for an aerosolisation session.

FIGS. 3A, 3B and 3C show exemplary plots of heater temperature 304, average power 312 delivered to the heater and overall energy consumption 314 (respectively) against time 302 for an aerosolisation session. In the preheating phase the controller 102 controls the power system to apply power to the heater for the first time period 308, until the heater temperature reaches the predetermined temperature 306. In an example, the predetermined temperature is 230° C. In an example, the first time period is 20 seconds. In some examples, the controller 102 is configured to heat the heater to the predetermined temperature within a fixed predetermined first time period. In other examples the first time period varies depending on how long the heater takes to reach the predetermined temperature.

When the heater reaches the predetermined temperature 306, the controller 102 switches the operating mode to the float mode for the second time period 310 and maintains the heater temperature substantially at the predetermined temperature 306 for this second time period 310. In an example, the second time period may be 250 seconds.

Typically, a lower power level is applied to the heater in the float mode when maintaining the heater at the predetermined temperature, than the power level applied to the heater to heat it to the predetermined temperature in the preheating mode. This can be seen in FIG. 3B in that the power delivered to the heater in the second time period 310 (float mode) is lower than the power delivered to the heater in the first time period 308 (preheating mode). The power level delivered to the heater can be controlled by various means, for example adjusting the power output from the energy storage module, or by adjusting the on/off periods in a pulse width modulated power flow (as subsequently described).

Following the aerosolisation session the user of the aerosol generation device may be informed that the aerosolisation session has ended, by way of a visual or audible indicator, so that they are aware that the consumable is no longer being aerosolised.

In the preheating and float modes, the controller 102 can control the power flow from the power system to the heater such that the power flow is a pulse width modulated power flow having one or more pulse width modulation cycles. An exemplary pulse width modulated power flow is presented in FIG. 4. A pulse width modulated power flow comprises one or more pulse width modulation (PWM) cycles 402 (also known as pulse width modulation switching periods). A single PWM cycle, or switching period, 402 comprises one PWM cycle "on period" D and one PWM cycle "off period" 1-D. The combination of the PWM cycle on period D and the PWM cycle off period 1-D forms the overall PWM cycle or switching period 402.

During the PWM on period of the PWM cycle, power is applied to the heater by closing a switch that implements the PWM control in a power line to the heater. During the PWM off period power is not applied to heater by opening a switch that implements the PWM control in a power line to the heater. The switch that implements that PWM control can, for example, be a transistor in a PWM module that is controlled by the controller 102.

One pulse width modulation cycle 402 comprises the power being switched once between an on state and an off state, and a pulse width modulated power flow therefore comprises continuously powering the heater with a power flow which is rapidly switched between PWM on periods and off periods with a duty cycle.

The pulse width modulation duty cycle corresponds to the on period (D) as a proportion of the total period (D+(1−D)) of the cycle 402 (i.e. the combined "on period" and "off period" of the switching period 402).

The pulse width modulated power flow, comprising a plurality of PWM cycles, continuously powers the heater with the average power of the PWM on period and the PWM off period based upon the duty cycle. Controlling the duty cycle controls the amount of power delivered to the heater. A higher duty cycle for the pulse width modulated power flow delivers a higher average power; a lower duty cycle for the pulse width modulated power flow delivers a lower average power. That is, for a higher duty cycle a greater proportion of the cycle 402 is the "on period" D than for a lower duty cycle. In this way, careful control of the level of power applied to the heater can be achieved by controlling the duty cycle of the pulse width modulated power flow.

In the float mode, the controller 102 is configured to control the power system to apply the pulse width modulated power flow to the heater with a first duty cycle regime to maintain the heater substantially at the predetermined aerosol generation temperature. In the preheating mode, the controller 102 is configured to control the power system to apply the pulse width modulated power flow to the heater with a second duty cycle regime, different to the first duty cycle regime, to heat the heater to the aerosol generation temperature. The second duty cycle regime can have a higher duty cycle than the first duty cycle regime, in this way a greater amount of power is applied to the heater to rapidly heat it to the predetermined temperature, whilst a lower amount of power is used to maintain the heater at the predetermined temperature. The first duty cycle regime comprises one or more PWM cycles with a first duty cycle ratio D1, and the second duty cycle regime comprises one or more PWM cycles with a second duty cycle ratio D2; the relationship between D1 and D2 can be considered as D2=D1*K, where K is a coefficient that is >>1 and can be selected as an implementation choice; the theoretical maximum duty cycle is 1 with no off period, or close to but less than 1 with a very short off period. In examples, the first duty cycle regime comprises one or more duty cycles with duty cycle ratios much less than 1 and the second duty cycle regime comprises one or more duty cycles with duty cycle ratios near to but less than 1. In other examples, the first duty cycle regime comprises one or more duty cycles with duty cycle ratios <<0.5 and the second duty cycle regime comprises one or more duty cycles with duty cycle ratios ≥0.5. In further examples, the first duty cycle is configured such that <3 W is applied in the float mode, and the second duty cycle is configured such that approximately 16 W is applied in the preheating mode. In other examples, the first duty cycle regime can be variable in that the duty cycle is adapted during the float mode in order to maintain the heater at the predetermined temperature; typically, this variable duty cycle in the first duty cycle regime is less than the higher duty cycle used in the second duty cycle regime for the preheating mode.

Figure 4:
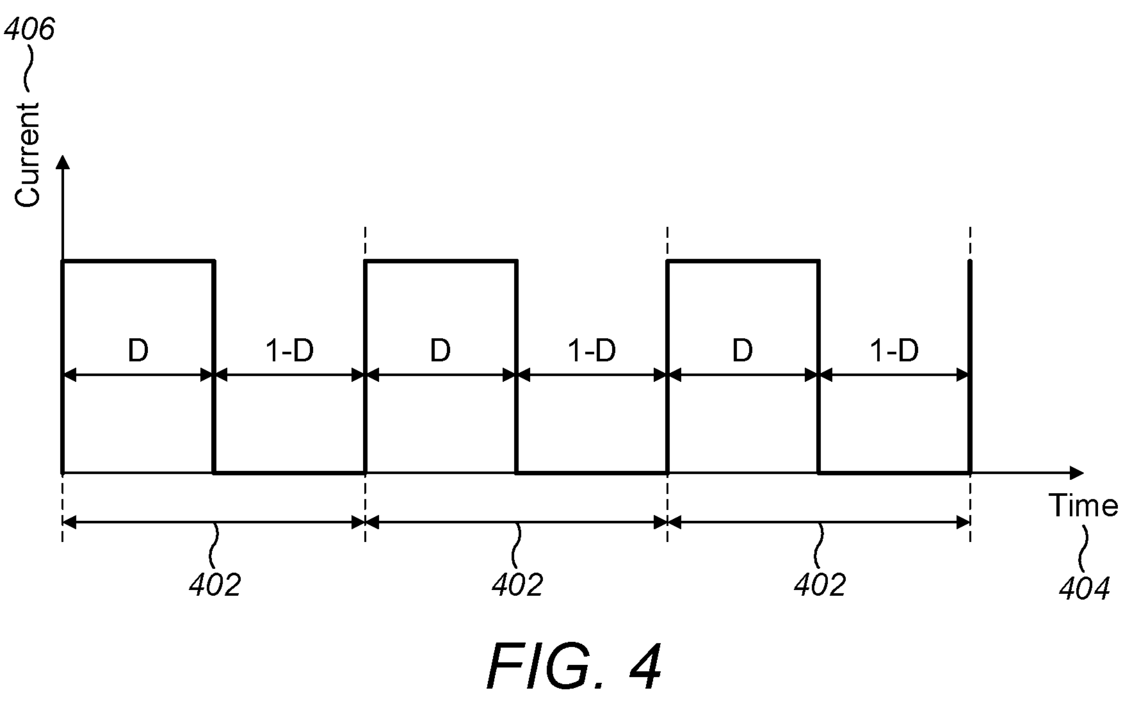
FIG. 4 is a plot of a pulse width modulated power flow.
Figure 5:
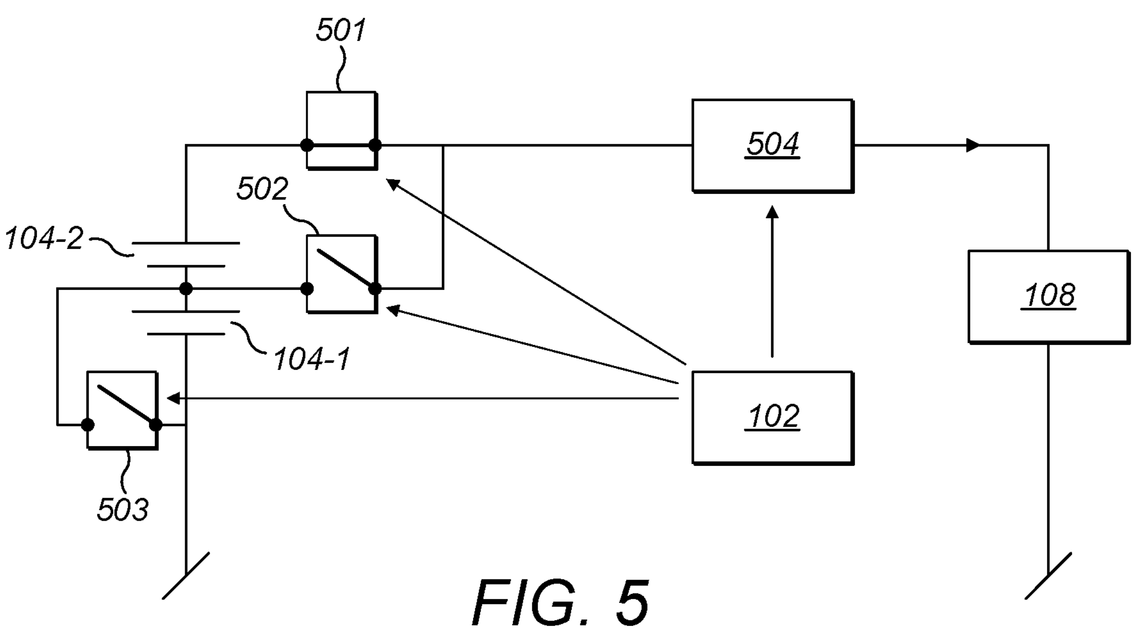
FIG. 5 is a diagram of a power system in a first state.

FIG. 5 presents a specific implementation of the power system described with reference to FIGS. 1 to 4.

In the example of FIG. 5, the energy storage module 104 is a battery pack (a 2s1p battery pack) having a first battery cell 104-1 and a second battery cell 104-2 connected in series with one another. In an alternative, the 2s1p battery pack may be two separate batteries connected in series with one another.

The first battery cell 104-1 and the second battery cell 104-2 are connected to the heater 108 such that one or both of the first battery cell 104-1 and the second battery cell 104-2 provide power to the heater 108 during an aerosolisation session.

The power system further comprises a PWM module 504, as described with reference to FIG. 4, configured to convert the power flow from the first battery cell 104-1 and the second battery cell 104-2 to a PWM power flow to be delivered to the heater 108. The PWM module is controlled by the controller 102.

A heater temperature sensor (not shown, for clarity) can be arranged at the heater 108, in communication with the controller 102, to monitor the heater temperature or the temperature in the heating cavity/chamber 110. One or more battery temperature sensors (again not shown, for clarity) can also be arranged at the first battery cell 104-1 and the second battery cell 104-2, in communication with the controller 102, so that the controller can monitor the operating temperature of the battery cells.

The power system of FIG. 5 has a switching means comprising three switches: a first switching means 501, and second switching means 502, and a third switching means 503.

The first switching means 501 is connected in series with the second battery cell 104-2, with the second battery cell 104-2 connected between the first battery cell 104-1 and the first switching means 501. The second switching means 502 connected to a node between the first battery cell 104-1 and the second battery cell 104-2, and in parallel with the second battery cell 10-4, such that when the second switching means 502 is closed the second battery cell 104-2 is bypassable. The third switching means 503 is connected to a node between the first battery cell 104-1 and the second battery cell 104-2 and in parallel with first battery cell 104-1, such that when the third switching means 503 is closed the first battery cell is bypassable. The first switching means 501, second switching means 502 and third switching means 503 can be transistors connected to a controlled by the controller 102.

In FIG. 5, the power system is in a first state. In the first state, both the first battery cell and the second battery cell are configured to provide power to the heater. The first switching means 501 is closed, the second switching means 502 is open and the third switching means 503 is open. In this way, the power system is configured such that both the first battery cell 104-1 and the second battery 104-2 are connected in series to provide power to the heater 108.

In response to detecting a triggering condition, the controller can control the switching means such that the power system is reconfigured from the first state to a second state. In the second state, only one of the first battery cell 104-1 or the second battery cell 104-2 is configured to power the heater.

Figure 6A:
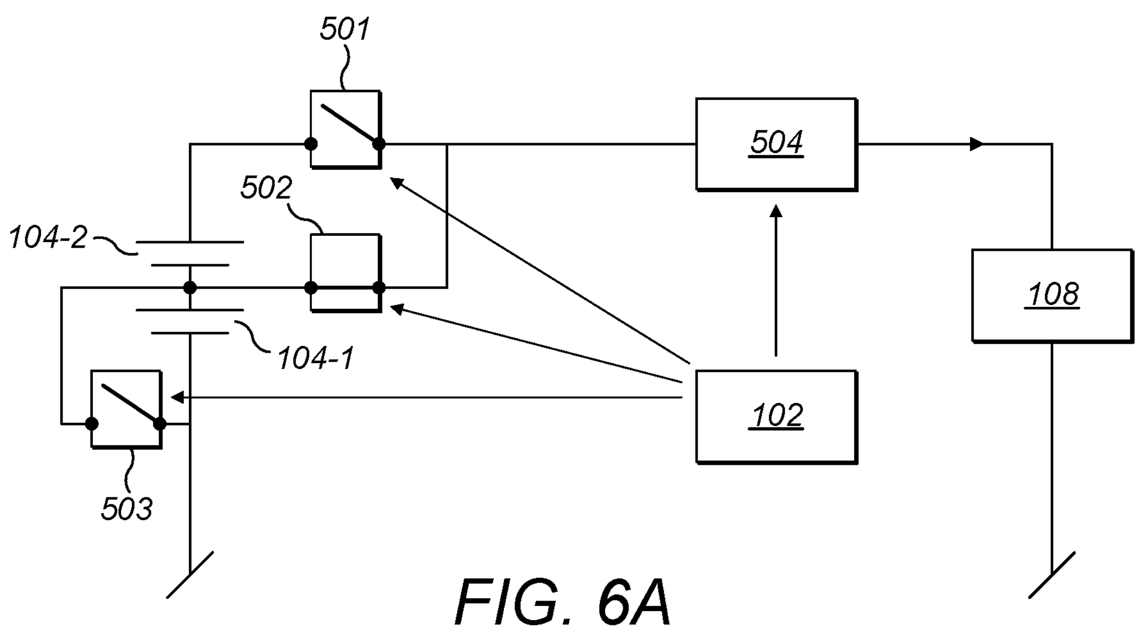
FIG. 6A is a diagram of a power system in a second state in which only the first battery cell is configured to power the heater.

FIG. 6A shows the power system of FIG. 5 reconfigured in a second state (or first reconfigured state) in which only the first battery cell is configured to power the heater. The second battery cell is bypassed/isolated. This is achieved by switching the switching means such that the first switching means is open, the second switching means is closed, and the third switching means is open.

Figure 6B:
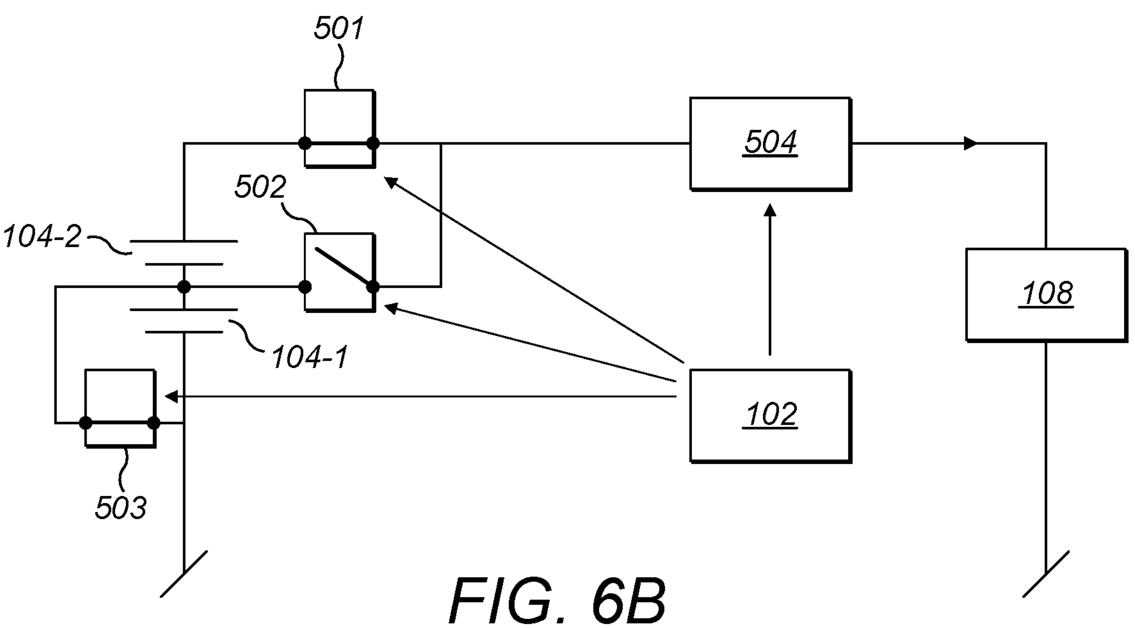
FIG. 6B is a diagram of a power system in a second state in which only the second battery cell is configured to power the heater.

FIG. 6B shows the power system of FIG. 5 reconfigured in a second state (or second reconfigured state) in which only the second battery cell is configured to power the heater. The first battery cell is bypassed/isolated. This is achieved by switching the switching means such that the first switching means is closed, the second switching means is open, and the third switching means is closed.

The third switching means 503 can be considered a bypass switch for the first battery cell 104-1, as when closed it allows for the first battery cell 104-1 to be bypassed. The second switching means 502 can be considered a bypass switch for the second battery cell 104-2, as when closed it allows for the second battery cell 104-2 to be bypassed.

The controller 102 is configured to monitor an energy parameter of the first battery cell 104-1 and the second battery cell 104-2. For example, the controller 102 can monitor the voltage of each of the first battery cell 104-1 and the second battery cell 104-2. In this manner, the energy parameter of the first battery cell 104-1 can be a voltage level of the first battery cell 104-1, and the energy parameter of the second battery cell 104-2 can be a voltage level of the second battery cell 104-2. Although not shown, for clarity, in FIGS. 5 and 6 this can be brought about by a first voltmeter connected across the first battery cell 104-1 and a second voltmeter connected across the second battery cell 104-2, with the first a second voltmeters in communication with the controller 102. In some examples the first voltmeter may be implemented as voltage sensor or voltage sensing circuit connected to the first battery cell, and the second voltmeter may be implemented as a voltage sensor or voltage sensing circuit connected to the second battery cell.

The aforementioned triggering condition, upon the detection of which the controller 102 controls the switching means to switch the power system from a first state to a second state, comprises the controller 102 determining that one of the first battery cell 104-1 or the second battery cell 104-2 does not have a sufficient energy level to finish an aerosolisation session, and the other one of the first battery cell 104-1 and the second battery cell 104-2 does have a sufficient energy level to finish the aerosolisation session. This determination is based upon the monitored energy parameter of the first battery cell 104-1 and the monitored energy parameter of the second battery cell 104-2.

When the controller 102 determines, based upon the monitored energy parameter of the first battery cell 104-1 and the monitored energy parameter of the second battery cell 104-2, that the second battery cell 104-2 does not have a sufficient energy level to finish the aerosolisation session, and the first battery cell 104-1 does have a sufficient energy level to finish the aerosolisation session, the controller 102 switches the power system from the first state to the second state described with reference to FIG. 6A. In this way, the first battery cell 104-1 that has sufficient energy to finish the aerosolisation session is connected to the heater 108 independently of the second battery cell 104-2. The second battery cell 104-2, that does not have sufficient energy to finish the aerosolisation session, is isolated from the heater 108. As such, only the first battery cell 104-1, which does have a sufficient energy level to finish the aerosolisation session is configured to provide power to the heater 108.

When the controller 102 determines, based upon the monitored energy parameter of the first battery cell 104-1 and the monitored energy parameter of the second battery cell 104-2, that the first battery cell 104-1 does not have a sufficient energy level to finish the aerosolisation session, and the second battery cell 104-2 does have a sufficient energy level to finish the aerosolisation session, the controller 102 switches the power system from the first state to the second state described with reference to FIG. 6B. In this way, the second battery cell 1042 that has sufficient energy to finish the aerosolisation session is connected to the heater 108 independently of the first battery cell 104-1. The first battery cell 104-1, that does not have sufficient energy to finish the aerosolisation session, is isolated from the heater 108. As such, only the second battery cell 104-2, which does have a sufficient energy level to finish the aerosolisation session is configured to provide power to the heater 108.

In other words, when the controller 102 determines that one of the battery cells does not have a sufficient energy level to finish the aerosolisation session, and the other battery cell does have a sufficient energy level to finish or prolong the aerosolisation session, the controller controls the switching means to reconfigure the power system such that only the battery cell that has a sufficient energy level to finish or prolong the aerosolisation session is connected to the heater. If neither battery cell has a sufficient energy level to finish or prolong the aerosolisation session, the aerosolisation session continues without reconfiguration.

Connecting the first battery cell 104-1 and the second battery cell 104-2 in series is advantageous in that a higher output voltage is provided than, for example, connecting batteries in parallel. This higher output voltage removes the need to include a DC/DC or step-up converter in the power system in order to provide the required power to the heater 108. Consequently, the energy efficiency losses due to the inclusion of a DC/DC or step-up converter are obviated, and component costs are reduced. The provision of a higher output voltage also allows for the implementation of heater technologies that have a higher resistance in the device.

Furthermore, increasing the voltage to achieve higher power allows for a reduction in the maximum current requirements on each battery cell. This allows for higher energy density batteries to be used (i.e. batteries with a smaller size for the same energy content).

Other advantages are found in the provision of more efficient and easier implementation of fast charging. The power of the charging can be increased with the same range of current rates. Typically, higher current rates would require an increase in device size for the sake of better thermal management. By allowing for the power of charging to be increased with the same range of current rates, this issue is obviated. Furthermore, the problem of a limited choice of chagrining ICs and electronics for high current is limited, and this problem is therefore also obviated.

However, the use of two battery cells in series (e.g. a 2s1p battery pack) can present a problem when one of the battery cells is weaker than the other. In the first state, because the first battery cell 104-1 and second battery cell 104-2 are connected in series, the weaker battery cell (i.e. the battery cell that does not have sufficient energy to finish the aerosolisation session) limits the performance of the battery pack. The weaker cell "pulls" the cell/system voltage to a very low level. This can prevent the battery pack from providing the necessary power to complete the aerosolisation session, even if the stronger battery cell does have sufficient energy available.

This problem can be caused by an inhomogeneity between battery cells that becomes more prevalent with time, or with the number of charging and discharging cycles.

Figure 9:
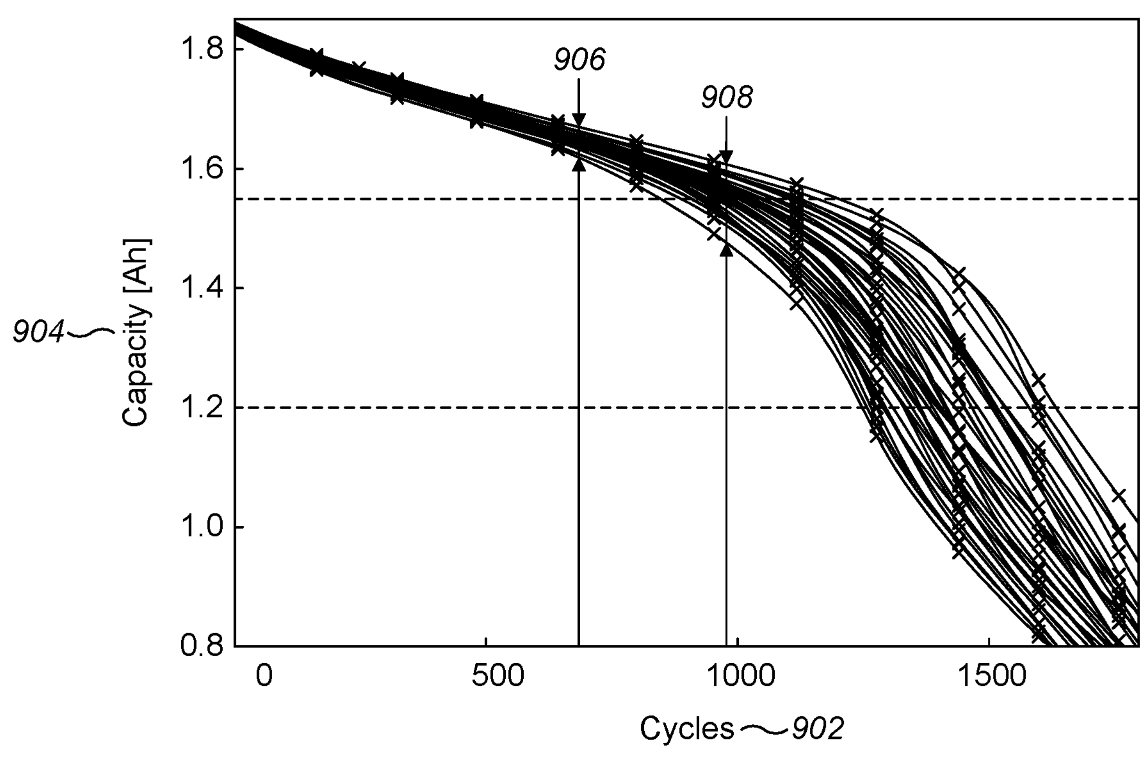
FIG. 9 is a plot of the change in charge capacity of a number of battery cells as the number of charging and discharging cycles increases.

Turning to FIG. 9, a plot is presented of the change in charge capacity 904 of a number of battery cells as the number of charging and discharging cycles 902 increases. This data relates to 48 commercial 18650 2 Ah cells produced by PANASONIC (results published in Journal of Power Sources, Volume 247, 1 Feb. 2014, Pages 332-338). A 2s1p battery pack can store charge for approximately 20 aerosolisation sessions (i.e. aerosolising 20 tobacco rods). On the basis a consumer performing 20 aerosolisation sessions per day, the line 906 corresponds to approximately two years of usage. As can be seen, there is a visible difference between the battery cell with the highest capacity and the battery cell with the lowest capacity. This difference has increased with the number of charging and discharging cycles. After around 2 years, the spread can be as great as 5%, which corresponds to an entire aerosolisation session. This means that after 2 years of use, aerosol generation device that might once have been able to power 20 aerosolisation sessions would then only be able to power 19 sessions. Line 908 corresponds to approximately three years of usage, where the difference between the battery cell with the highest capacity and the battery cell with the lowest capacity is even greater. If a 2s1p battery pack contained a first battery cell at the upper end of this charge capacity range, and a second battery cell at the lower end of this charge capacity range, the overall performance of the battery pack would be limited by the weaker second battery cell. Consequently, the longevity of the aerosol generation device is affected.

Figure 10:
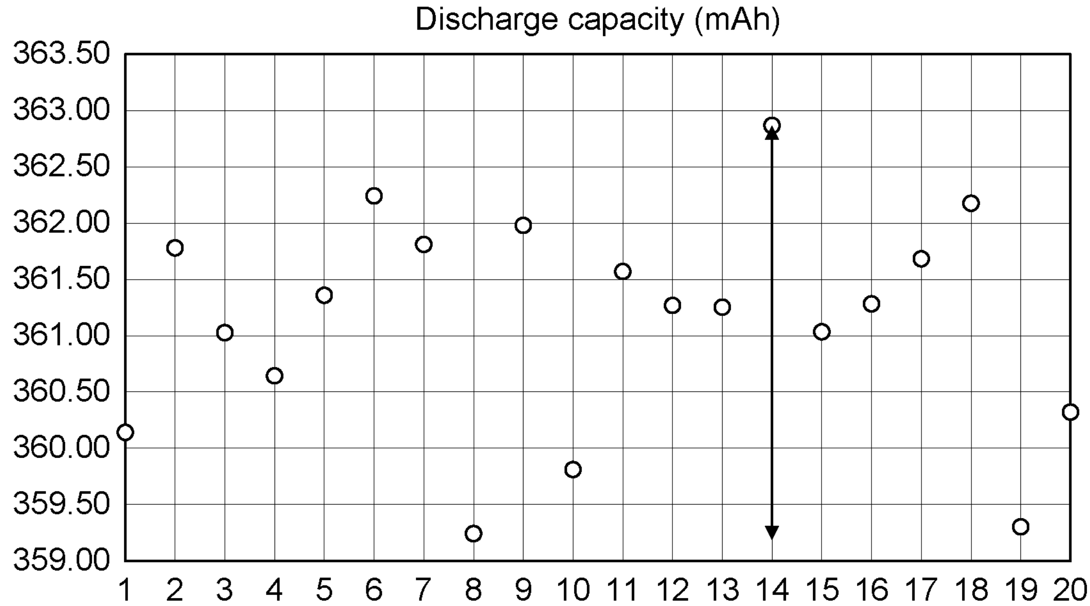
FIG. 10 is a plot of the discharge capacity of a number of battery cells.

Even for new battery cells there can be an inhomogeneity between cells, for example due to manufacturing tolerances. FIG. 10 shows a plot of the discharge capacity of 20 350 mAh pouch cells. As can be seen, there is a considerable difference (around 4 mAh or 1.1%) between the discharge capacity of the battery cell with the highest discharge capacity (number 14) and the battery cell with the lowest discharge capacity (number 8).

An inhomogeneity between battery cells can also be caused by temperature gradients within the aerosol generation device, which can cause different temperatures and different rates of aging for each of the battery cells. Different temperatures between the battery cells can also cause different self-discharge rates between the two battery cells.

As explained above, a weaker battery cell in a series arrangement limits the performance of the overall battery pack. The present invention overcomes such problems. Switching to the second state, in which one of the first battery cell 104-1 or the second battery cell 104-2 is connected to the heater component 108 independently of the other of the first battery cell 104-1 or the second battery cell 104-2 overcomes the problems associated with the weaker battery cell as the weaker battery cell (the battery cell with an insufficient energy level) is isolated. This removes the limitation in performance due to the weaker cell.

This allows for the advantages of connecting the battery cells in series to be leveraged, whilst avoiding the issues that would occur if one of the battery cells in series was to have insufficient energy to complete the aerosolisation session.

The monitoring of the energy parameters of the first battery cell 104-1 and the second battery cell 104-2, and the detection of the triggering condition, can take place during an aerosolisation session or before an aerosolisation session.

The controller 102 can be configured to monitor the energy parameter of the first battery cell 104-1 and the energy parameter of the second battery cell 104-2 during an aerosolisation session. In response to determining the triggering condition during the aerosolisation session, the controller 102 is configured to switch the power system from the first state to the second state for a remainder of the aerosolisation session.

That is, during an aerosolisation session, if the controller 102 identifies that the first battery cell 104-1 does not have a sufficient energy level to complete the session (i.e. the first battery cell 104-1 is a weaker cell), but the second battery cell 104-2 does have a sufficient energy level to complete the session, the controller 102 switches the power system from the first state (e.g. FIG. 5) to the second state in which only the second battery cell 104-2 is configured to provide power to the heater 108 (e.g. FIG. 6B).

Figure 7:
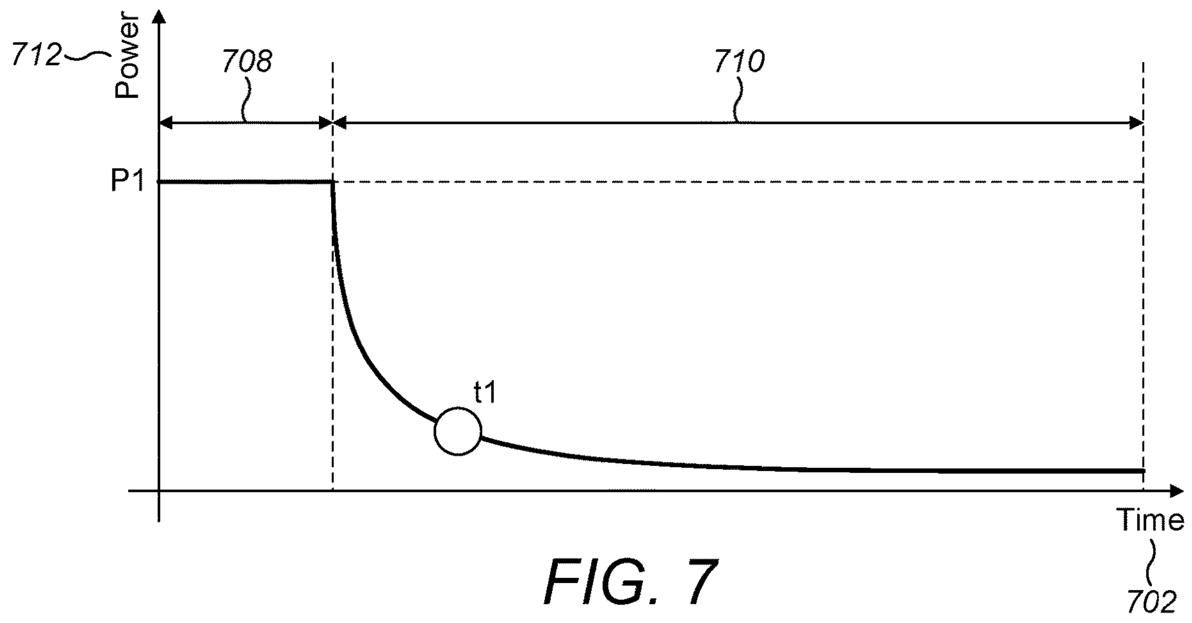
FIG. 7 is a plot of power delivered to the heater against time for a power system that is reconfigured to a second state during a float phase.

FIG. 7 shows a plot of power 712 delivered to the heater against time 702 for an aerosolisation session having a preheating phase 708 and a floating phase 710. During the aerosolisation session, the controller 102 is monitoring the energy parameters if the first battery cell 104-1 and the second battery cell 104-2. At time t1 the controller 102 determines that the first battery cell 104-1 does not have a sufficient energy level to finish an aerosolisation session. That is, before the end of the aerosolisation session, the first battery cell 104-1 will become flat. As can be seen, after time t1, the power required to finish the session is comparatively low compared to the power required for the overall session. If the controller 102 determines the second battery cell 104-2 has a sufficient energy level to finish the aerosolisation session (or at least prolong it), the controller 102 can switch the power system from the first state (e.g. FIG. 5) to the second state in which only the second battery cell 104-2 is configured to provide power to the heater (e.g. FIG. 6B). In this way, the weaker first battery cell 104-1 does not limit the performance of the overall power system and the aerosolisation session that has already started can be completed.

Likewise, during an aerosolisation session, if the controller 102 identifies that the second battery cell 104-2 does not have a sufficient energy level to complete the session (i.e. the second battery cell is the weaker cell), but the first battery cell 104-1 does have a sufficient energy level to complete the session, the controller 102 switches the power system from the first state (e.g. FIG. 5) to the second state in which only the first battery cell 104-1 is configured to provide power to the heater 108 (e.g. FIG. 6A).

That is, both battery cells can deliver power for the preheating phase, and part of the float phase, with one battery cell delivering power for the remaining part of the float phase.

Additionally or instead of being configured to monitor the energy parameters of the first battery cell and the second battery cell during an aerosolisation session, the controller 102 can also be configured to monitor the energy parameter of the first battery cell 104-1 and the energy parameter of the second battery cell 104-2 before beginning an aerosolisation session. In response to determining the triggering condition before beginning the aerosolisation session, the controller 102 is configured to set the power system to the second state for the aerosolisation session.

That is, before an aerosolisation session, if the controller 102 identifies that the first battery cell 104-1 does not have a sufficient energy level to complete the session (i.e. the first battery cell is a weaker cell), but the second battery cell 104-2 does have a sufficient energy level to complete (or partially complete/prolong with respect to the first battery cell 104-1) the session, the controller 102 switches the power system so that it is in the second state in which only the second battery cell 104-2 is configured to provide power to the heater 108 (e.g. FIG. 6B) when the aerosolisation session begins.

Figure 8:
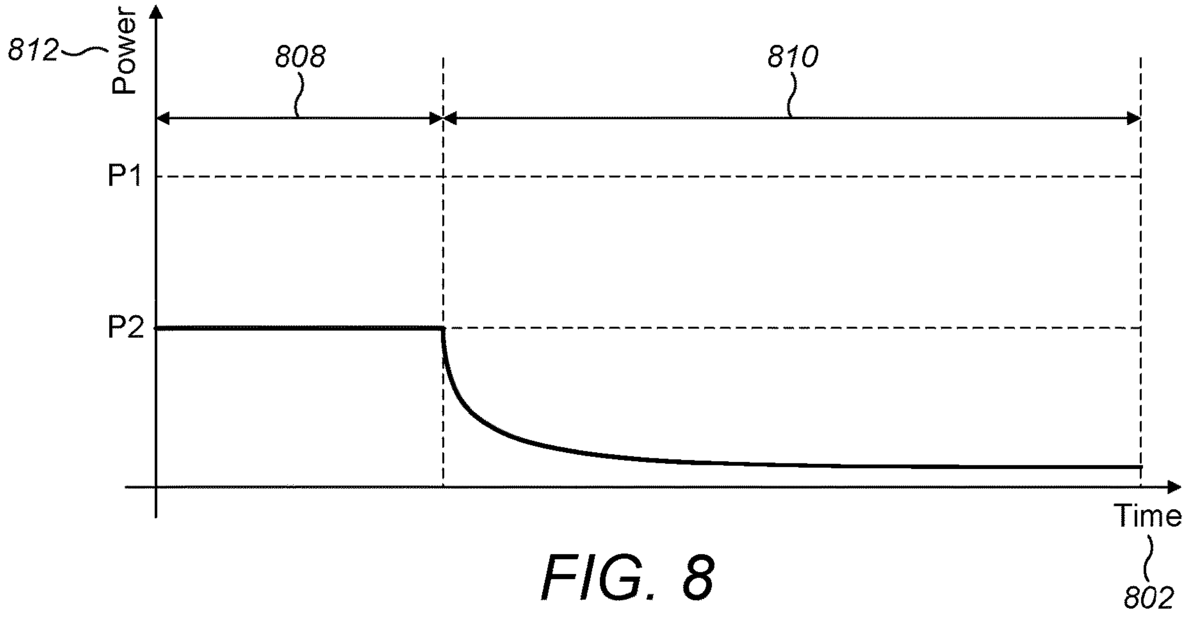
FIG. 8 is a plot of power delivered to the heater against time for a power system that is reconfigured to a second state before beginning an aerosolisation session.

FIG. 8 shows a plot of power 812 delivered to the heater 108 against time 802 for an aerosolisation session having a preheating phase 808 and a floating phase 810. Before the aerosolisation session, the controller 102 monitors the energy parameters if the first battery cell 104-1 and the second battery cell 104-2. If the controller 102 determines, before the aerosolisation session begins, that the first battery cell 104-1 does not have a sufficient energy level to complete the aerosolisation session, the controller 102 can switch the power system so that it is in the second state in which only the second battery cell 104-2 is configured to provide power to the heater 108 (e.g. FIG. 6B) for the aerosolisation session. In this way, the weaker first battery cell 104-1 does not limit the performance of the overall power system and the aerosolisation session can be carried out.

Likewise, before an aerosolisation session, if the controller 102 identifies that the second battery cell 104-2 does not have a sufficient energy level to complete the session (i.e. the second battery cell is a weaker cell), but the first battery cell 104-1 does have a sufficient energy level to complete (or partially complete/prolong with respect to the second battery cell 104-2) the session, the controller 102 switches the power system so that it is in the second state in which only the first battery cell 104-1 is configured to provide power to the heater 108 (e.g. FIG. 6A) when the aerosolisation session begins.

If, before the aerosolisation session begins, the controller 102 determines that one of the first battery cell 104-1 or the second battery cell 104-2 does not have a sufficient energy level to complete the session, but the other battery cell does have a sufficient energy level to complete the session, such that only one of the battery cells is to be used to power the aerosolisation session (as previously described) the controller 102 can adjust the parameters of the preheating mode to accommodate the aerosolisation session being powered by a single cell in the battery pack. For example, the power level applied in the preheating phase can be reduced, to reduce the strain on the single battery cell. In order to adequately pre-heat the heater 108, the preheating time 808 can then be increased. This can be seen in FIG. 8, in which the applied power level (P2) in the preheating phase 808 is comparatively lower than the applied power level in the preheating phase (P1) in FIG. 7 which uses both battery cells for the preheating, with the preheating phase 808 in FIG. 8 being comparatively longer in time than the preheating phase 708 in FIG. 7.

In this way, the weaker battery cell does not limit the performance of the overall power system, and does not reduce or inhibit the aerosol generation device being able to perform an aerosolisation session.

In the aforementioned example, determining, before the aerosolisation session begins, that one of the battery cells does not have a sufficient charge level to complete the aerosolisation session, can be indicative that the battery pack is reaching the end of its working life. As such, when the controller 102 determines the triggering condition before beginning the aerosolisation session, the controller 102 can be configured to inform the operator, by an indicator or interface, that the device and/or battery should soon be replaced.

Based upon the monitored energy parameters, the controller 102 can determine whether an aerosolisation session can be completed without reconfiguring the power system from the first state to the second state, with reconfiguration from the first state to the second state, or whether it is not achievable to finish the aerosolisation session with or without reconfiguration. When it is not achievable to finish the aerosolisation session with or without reconfiguration, the controller can determine to show to the user that the battery pack is empty.

In the foregoing examples, the controller 102 monitors energy parameters of the first battery cell 104-1 and the second battery cell 104-2, with the triggering condition comprising the controller 102 determining, based upon the monitored energy parameter of the first battery cell 104-1 and the monitored energy parameter of the second battery cell 104-2, that one of the first battery cell 104-1 or the second battery cell 104-2 does not have a sufficient energy level to finish an aerosolisation session, and the other one of the first battery cell 104-1 and the second battery cell 104-2 does have a sufficient energy level to finish or prolong the aerosolisation session.

In an example, the monitored energy parameters are the voltage of the first battery cell 104-1 and the voltage of the second battery cell 104-2. When the voltage of a battery cell is above a predetermined threshold voltage, the battery cell is determined to have sufficient energy to complete (or prolong) the aerosolisation session. When the voltage is not above the predetermined threshold voltage, the battery cell is determined to not have sufficient energy to complete the aerosolisation session. In some examples, the predetermined threshold voltage can be at a fixed voltage level. In other examples the predetermined threshold voltage can be time-varying with the remaining time in the aerosolisation session. The predetermined threshold voltage can be stored in memory associated with the controller 102.

In a related example, the rate of change of the voltage of the first battery cell 104-1 and the rate of change of voltage of the second battery cell 104-2 are monitored as a function of time in the aerosolisation session (i.e. the rate of voltage decrease as a function of time in the aerosolisation session). When the rate of change does not exceeds a predetermined threshold, the battery cell is determined to have sufficient energy to complete (or prolong) the aerosolisation session. When the rate of change is above the predetermined threshold, the battery cell is determined to not have sufficient energy to complete the aerosolisation session as a cell that is about to be fully discharged shows significantly higher voltage gradient than a cell which is not about to be fully discharged. The predetermined threshold rate of change can be stored in memory associated with the controller 102.

In another example, the controller determines that one of the battery cells does not have a sufficient energy level to finish an aerosolisation session, and the other battery cell does have a sufficient energy level to finish the aerosolisation session, when the difference between the monitored energy parameters (e.g. voltage) between the two battery cells exceeds a predetermined allowable difference (or threshold difference). When the difference between the monitored energy parameters (e.g. voltages) between the two battery cells exceeds a predetermined threshold difference, the battery cell with the lower voltage can be considered to be the battery cell that does not have a sufficient energy level to finish an aerosolisation session. A difference in voltage between the two battery cells, exceeding an allowable difference, can be indicative of one cell being weaker than the other.

In another example, the controller can determine that one of the battery cells does not have a sufficient energy level to finish an aerosolisation session, and the other battery cell does have a sufficient energy level to finish (or prolong) the aerosolisation session by using a continuous determination of available energy in both cells to make a decision whether a full aerosolisation session is achievable with two cells, with reconfiguration to one cell, or if it is not achievable with or without reconfiguration of the power system. Such continuous determination can be done with a state-of-charge estimation algorithm, state-of-health and available power estimation algorithms.

Figure 11:
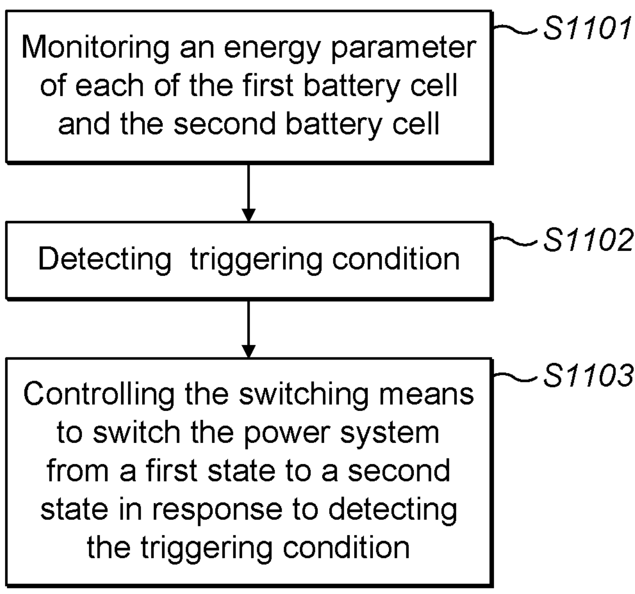
FIG. 11 is process flow of steps performed by the controller in determining to switch the power system from a first state to a second state.

FIG. 11 presents an exemplary process flow of the steps performed by the controller 102 in determining to switch the power system from a first state to a second state in accordance with the foregoing description. It will be understood that any of the features described previously can be included in this process flow.

At step S1101, the controller 102 monitors an energy parameter of each of the first battery cell 104-1 and the second battery cell 104-2.

At step S1102, the controller 102 detects a triggering condition. The triggering condition comprises determining, based upon the monitored energy parameter of the first battery cell 104-1 and the monitored energy parameter of the second battery cell 104-2, that one of the first battery cell 104-1 or the second battery cell 104-2 does not have a sufficient energy level to finish an aerosolisation session, and the other one of the first battery cell 104-1 and the second battery cell 104-2 does have a sufficient energy level to finish or prolong the aerosolisation session.

At step S1103, the controller 102 controls the switching means to switch the power system from a first state to a second state in response to detecting the triggering condition. In the first state, the first battery cell 104-1 and the second battery cell 104-2 are configured to provide power to the heater component 108 in series. In the second state, one of the first battery cell 104-1 or the second battery cell 104-2 is connected to the heater component independently of the other of the first battery cell 104-1 or the second battery cell 104-2, such that only the one of the first battery cell 104-1 or the second battery cell 104-2 that has a sufficient energy level to finish the aerosolisation session is configured to provide power to the heater 108.

In the preceding description, the controller 102 can store instructions for controlling the aerosol generation device and power system in the described manners. The skilled person will readily understand that the controller 102 can be configured to execute any of the aforementioned manners in combination with one another as appropriate. The processing steps described herein carried out by the controller 102 may be stored in a non-transitory computer-readable medium, or storage, associated with the controller 102. A computer-readable medium can include non-volatile media and volatile media. Volatile media can include semiconductor memories and dynamic memories, amongst others. Non-volatile media can include optical disks and magnetic disks, amongst others.

It will be readily understood to the skilled person that the preceding embodiments in the foregoing description are not limiting; features of each embodiment may be incorporated into the other embodiments as appropriate.

The invention claimed is:

1. An aerosol generation device power system, wherein the power system is connectable to a heater component, and the power system comprises:

a first battery cell and a second battery cell connectable in series;

a switch configured to control a power flow from the first battery cell and the second battery cell to the heater component; and a controller configured to monitor an energy parameter of each of the first battery cell and the second battery cell and to control the switch, wherein the controller is configured to control the switch to switch the power system from a first state to a second state in response to detecting a triggering condition, wherein:

the triggering condition comprises the controller determining, based upon the monitored energy parameter of the first battery cell and the monitored energy parameter of the second battery cell, that one of the first battery cell or the second battery cell does not have a sufficient energy level to finish an aerosolisation session, and the other one of the first battery cell and the second battery cell does have a sufficient energy level to finish or prolong the aerosolisation session;

in the first state, the first battery cell and the second battery cell are configured to provide power to the heater component in series; and in the second state, one of the first battery cell or the second battery cell is connected to the heater component independently of the other of the first battery cell or the second battery cell, such that only the one of the first battery cell or the second battery cell that has a sufficient energy level to finish or prolong the aerosolisation session is configured to provide power to the heater component.

2. The aerosol generation device power system of claim 1, wherein the controller is configured to monitor the energy parameter of the first battery cell and the energy parameter of the second battery cell during an aerosolisation session; and in response to determining the triggering condition during the aerosolisation session, the controller is configured to switch the power system from the first state to the second state for a remainder of the aerosolisation session.

3. The aerosol generation device power system of claim 1, wherein the controller is configured to monitor the energy parameter of the first battery cell and the energy parameter of the second battery cell before beginning an aerosolisation session; and in response to determining the triggering condition before beginning the aerosolisation session, the controller is configured to set the power system to the second state for the aerosolisation session.

4. The aerosol generation device power system of claim 3, wherein in response to determining the triggering condition before beginning the aerosolisation session, the controller is further configured to increase a preheating time in the aerosolisation session.

5. The aerosol generation device power system of claim 1, wherein the energy parameter of the first battery cell is a voltage level of the first battery cell, and the energy parameter of the second battery cell is a voltage level of the second battery cell.

6. The aerosol generation device power system of claim 5, wherein the controller is configured to determine that one of the first battery cell or the second battery cell does not have a sufficient energy level to finish an aerosolisation session, and the other one of the first battery cell and the second battery cell does have a sufficient energy level to finish or prolong the aerosolisation session based upon a difference between the voltage level of the first battery cell and the voltage level of the second battery cell with a predetermined threshold voltage.

7. The aerosol generation device power system of claim 1, wherein the first battery cell and the second battery cell are components of a 2s1p battery pack.

8. The aerosol generation device power system of claim 1, wherein the switch comprises a first switch connected in series with the second battery cell, and the second battery cell is connected between the first battery cell and the first switch.

9. The aerosol generation device power system of claim 8, wherein the switch comprises a second switch connected to a node between the first battery cell and the second battery cell, and in parallel with the second battery cell, such that when the second switch is closed the second battery cell is bypassable.

10. The aerosol generation device power system of claim 9, wherein the switch comprises a third switch connected to the node between the first battery cell and the second battery cell and in parallel with first battery cell, such that when the third switch is closed the first battery cell is bypassable.

11. The aerosol generation device power system of claim 1, further comprising a pulse width modulation module configured to convert the power flow from the first battery cell and/or second battery cell to a pulse width modulated power flow to be delivered to the heater component.

12. An aerosol generation device comprising the aerosol generation device power system of claim 1.

13. The aerosol generation device of claim 12, wherein the aerosol generation device is configured to receive a tobacco rod, and heat without burning the tobacco rod to produce an aerosol in an aerosolisation session.

14. A method of operating an aerosol generation device power system, the power system comprising a first battery cell and a second battery cell connectable in series, and a switch configured to control a power flow from the first battery cell and the second battery cell to a heater component connectable to the power system, the method comprising:

monitoring an energy parameter of each of the first battery cell and the second battery cell;

detecting a triggering condition, wherein the triggering condition comprises determining, based upon the monitored energy parameter of the first battery cell and the monitored energy parameter of the second battery cell, that one of the first battery cell or the second battery cell does not have a sufficient energy level to finish an aerosolisation session, and the other one of the first battery cell and the second battery cell does have a sufficient energy level to finish or prolong the aerosolisation session; and controlling the switch to switch the power system from a first state to a second state in response to detecting the triggering condition, wherein:

in the first state, the first battery cell and the second battery cell are configured to provide power to the heater component in series; and in the second state, one of the first battery cell or the second battery cell is connected to the heater component independently of the other of the first battery cell or the second battery cell, such that only the one of the first battery cell or the second battery cell that has a sufficient energy level to finish or prolong the aerosolisation session is configured to provide power to the heater component.

15. A non-transitory computer-readable medium storing instructions that, when executed by one or more processors of a controller configured for operation with an aerosol generation device power system comprising a first battery cell and a second battery cell connectable in series, and a switch configured to control a power flow from the first battery cell and the second battery cell to a heater component connectable to the power system, cause the one or more processors to perform steps comprising:

monitoring an energy parameter of each of the first battery cell and the second battery cell;

detecting a triggering condition, wherein the triggering condition comprises determining, based upon the monitored energy parameter of the first battery cell and the monitored energy parameter of the second battery cell, that one of the first battery cell or the second battery cell does not have a sufficient energy level to finish an aerosolisation session, and the other one of the first battery cell and the second battery cell does have a sufficient energy level to finish or prolong the aerosolisation session; and controlling the switch to switch the power system from a first state to a second state in response to detecting the triggering condition, wherein:

in the first state, the first battery cell and the second battery cell are configured to provide power to the heater component in series; and in the second state, one of the first battery cell or the second battery cell is connected to the heater component independently of the other of the first battery cell or the second battery cell, such that only the one of the first battery cell or the second battery cell that has a sufficient energy level to finish or prolong the aerosolisation session is configured to provide power to the heater component.

* * * * *